(12) United States Patent
Weaver et al.

(10) Patent No.: US 7,699,635 B2
(45) Date of Patent: Apr. 20, 2010

(54) RANDOMLY-ACCESSIBLE ELECTRICAL BUSBAR WITH PROTECTIVE COVER AND ASSOCIATED MATING CONNECTOR

(75) Inventors: Thomas L. Weaver, Webster Groves, MO (US); Edward R. Winkler, St. Peter, MO (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/236,006

(22) Filed: Sep. 23, 2008

(65) Prior Publication Data

US 2010/0075533 A1    Mar. 25, 2010

(51) Int. Cl.
*H01R 25/00* (2006.01)
(52) U.S. Cl. .................. 439/291; 439/426; 439/930
(58) Field of Classification Search ............ 439/291, 439/426, 930, 212, 290, 37
See application file for complete search history.

(56) References Cited

U.S. PATENT DOCUMENTS

| 2,461,980 | A | * | 2/1949 | Hansen | 439/291 |
| 3,526,867 | A | * | 9/1970 | Keeler | 439/74 |
| 4,221,446 | A | * | 9/1980 | Niles et al. | 439/291 |
| 4,270,825 | A | * | 6/1981 | Marsh | 439/290 |
| 4,392,703 | A | * | 7/1983 | Hall et al. | 439/291 |
| 5,118,299 | A | * | 6/1992 | Burns et al. | 439/74 |
| 5,694,296 | A | * | 12/1997 | Urbish et al. | 361/774 |
| 5,774,341 | A | * | 6/1998 | Urbish et al. | 361/774 |
| 6,994,578 | B1 | * | 2/2006 | Chen | 439/291 |
| 7,204,704 | B2 | * | 4/2007 | Yamamoto | 439/174 |
| 2006/0046552 | A1 | * | 3/2006 | Chen | 439/291 |

OTHER PUBLICATIONS

Product Data Sheet, Amphenol® Ruggedized, Non-Floating Brush Rack and Panel Connect Series, Amphenol Corporation, 4 pages.

* cited by examiner

*Primary Examiner*—Gary F. Paumen
(74) *Attorney, Agent, or Firm*—Hope Baldauff Hartman LLC

(57) ABSTRACT

Apparatus and systems described herein provide for a randomly-accessible electrical busbar with a protective cover and an associated mating connector. Both the busbar and the associated mating connector have multiple, electrically conductive bristles protruding from a surface. The busbar is protected by a nonconductive fabric cover to reduce the risk of a person from accidentally contacting the electrically conductive bristles. A connection is made between the mating connector and the busbar by the bristles of the mating connector penetrating the protective fabric cover and interdigitating with the bristles of the busbar.

20 Claims, 4 Drawing Sheets

RANDOMLY-ACCESSIBLE ELECTRICAL BUSBAR WITH PROTECTIVE COVER AND ASSOCIATED MATING CONNECTOR

BACKGROUND

Connecting power and signals to avionics or other equipment modules in some commercial and military aircraft has traditionally involved dedicated cable harnesses for each module, adding weight to the aircraft and complexity to the avionics and electrical systems. In addition, this configuration makes adding new equipment modules to an existing aircraft expensive and time consuming. Other aircraft designs have incorporated equipment racks having discrete backplane connectors for power and signals that allow equipment modules to be added and removed more easily. However, these rack systems often have only a predetermined number of installation locations, limiting the number and configuration of equipment modules that may be installed.

More recently, signal wiring is sometimes consolidated into single fiber-optic connections or implemented via wireless infrared connections. The power connections for equipment modules, however, continue to be limited to discrete backplane connections or exposed metal busbars. While exposed metal busbar systems may provide the flexibility of adding any number of equipment modules at any location, they also present a safety hazard, in that the busbar may be accidentally contacted by a person installing modules or otherwise working in the avionics bay. Some metal busbars have rigid covers to protect against accidental contact with the busbar, but these covers may restrict connections to the bus to a limited number of discrete positions or may require the covers to be reconfigured each time a new equipment module is installed.

It is with respect to these considerations and others that the disclosure made herein is presented.

SUMMARY

It should be appreciated that this Summary is provided to introduce a selection of concepts in a simplified form that are further described below in the Detailed Description. This Summary is not intended to be used to limit the scope of the claimed subject matter.

Apparatus and systems described herein provide for the connection of electronic equipment modules to a covered electrical bus at random locations along the bus. According to aspects presented herein, a busbar is provided that has multiple, electrically conductive bristles protruding from the surface of the busbar. The busbar is protected by a nonconductive fabric cover to reduce the risk of a person from accidentally contacting the electrically conductive bristles. An associated mating connector is also provided which has similar electrically conductive bristles. A connection is made between the mating connector and the busbar at any location along the busbar by the bristles of the mating connector penetrating the protective fabric cover and interdigitating with the bristles of the busbar.

According to further aspects presented herein, a system for connecting equipment modules to a power bus is provided. The system includes a mounting framework upon which the equipment module is mounted. The mounting framework incorporates a power busbar having electrically conductive bristles protruding from the surface of the busbar. A nonconductive fabric cover is attached to the mounting framework to protect the busbar from accidental contact. An associated mating connector is connected to the equipment module. The mating connector has electrically conductive bristles similar to those on the busbar configured such that, when the equipment module is attached to the mounting framework, the bristles of mating connector penetrate the protective fabric cover and interdigitate with the bristles of the power busbar, establishing a connection between the power bus and the equipment module.

In yet a further aspect, a conductive fabric bus and associated mating connector are provided. The conductive fabric bus is protected by a nonconductive fabric cover to reduce the risk of a person from accidentally contacting the bus. The mating connector has electrically conductive bristles protruding from the surface of the connector. A connection can be made between the mating connector and the conductive fabric bus at any location along the bus by causing the bristles of the mating connector to penetrate the protective fabric cover and contact the conductive fabric bus.

The features, functions, and advantages discussed herein can be achieved independently in various embodiments of the present invention or may be combined in yet other embodiments, further details of which can be seen with reference to the following description and drawings.

DETAILED DESCRIPTION

The following detailed description is directed to apparatus and systems for connecting electronic equipment modules to a covered electrical bus at random locations along the bus. Utilizing the concepts and technologies described herein, a busbar can be added to an equipment rack or other mounting framework, such as those found in the avionics bay of an aircraft. A nonconductive fabric cover is located in front of the busbar to reduce the risk of accidental contact with the energized busbar by persons working in the avionics bay. Both the busbar and a mating connector for the bus have electrically conductive bristles such that when the mating connector is pressed against the busbar, the conductive bristles on the mating connector penetrate the protective fabric connector and interdigitate with the bristles on the busbar, forming an electrical connection.

Because the bristled busbar spans a length along the equipment rack or mounting framework, equipment modules incorporating the bristled mating connectors can be installed at any position in the rack or along the framework, as opposed to only being installed in fixed positions, as is the case with traditional backplane connections. Further, because the protective fabric cover runs continuously along the busbar, modules can be added to and removed from various positions in the rack or framework without leaving sections of the busbar unprotected, and without having to reconfigure rigid busbar covers with the installation of each module. These and other advantages and features will become apparent from the description of the various embodiments below.

Figure 1:
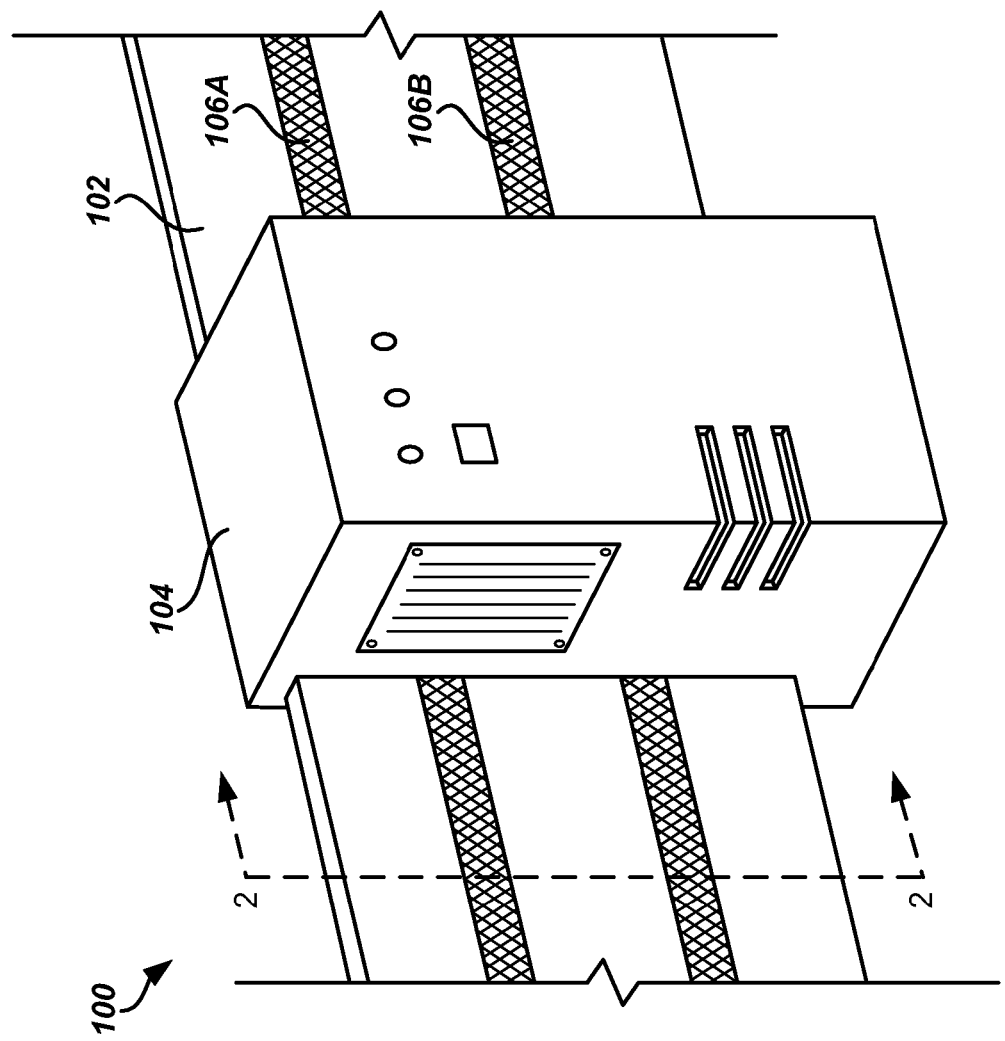
FIG. 1 is a perspective view of an equipment module attached to a mounting framework incorporating the randomly-accessible busbar, according to embodiments presented herein.

In the following detailed description, references are made to the accompanying drawings that form a part hereof, and that show by way of illustration specific embodiments or examples. Referring now to the drawings, in which like numerals represent like elements through the several figures, a randomly-accessible electrical busbar with protective cover and associated mating connector will be described. FIG. 1 shows an illustrative configuration 100 of elements of the randomly-accessible busbar system, according to embodiments. The configuration 100 includes a mounting framework 102 that may be installed along the walls of an avionics bay, for example. The mounting framework 102 may be made of any material sufficient to support the weight of attached equipment modules, such as metal or plastic. One or more equipment modules 104 may be attached to the mounting framework 102 at various positions. An equipment module 104 may be attached to the mounting framework 102 by a variety of methods, including bolts, VELCRO® from Velcro Industries B.V. of Manchester, N.H., or some other mechanical means.

According to embodiments, the mounting framework 102 incorporates the randomly-accessible busbar. In one embodiment, the mounting framework 102 may incorporate two, independent busbars, one to provide a power connection to attached equipment modules 104 and another to provide a connection to ground. It will be appreciated that any number of busbars may be incorporated into the mounting framework to carry a variety of power or other electrical signals. As illustrated in FIG. 1, the incorporated busbars run along the length of the mounting framework 102 and are protected by nonconductive fabric covers 106A-106B. The protective fabric covers 106A-106B cover the busbars along the length of the mounting framework 102 and reduce the risk of accidental contact between the busbars and persons installing equipment modules or otherwise working in the avionics bay. In one embodiment, the protective fabric covers 106A-106B cover the entire busbar. In another embodiment, only the portions of the busbars most vulnerable to accidental contact are covered.

Figure 2A:
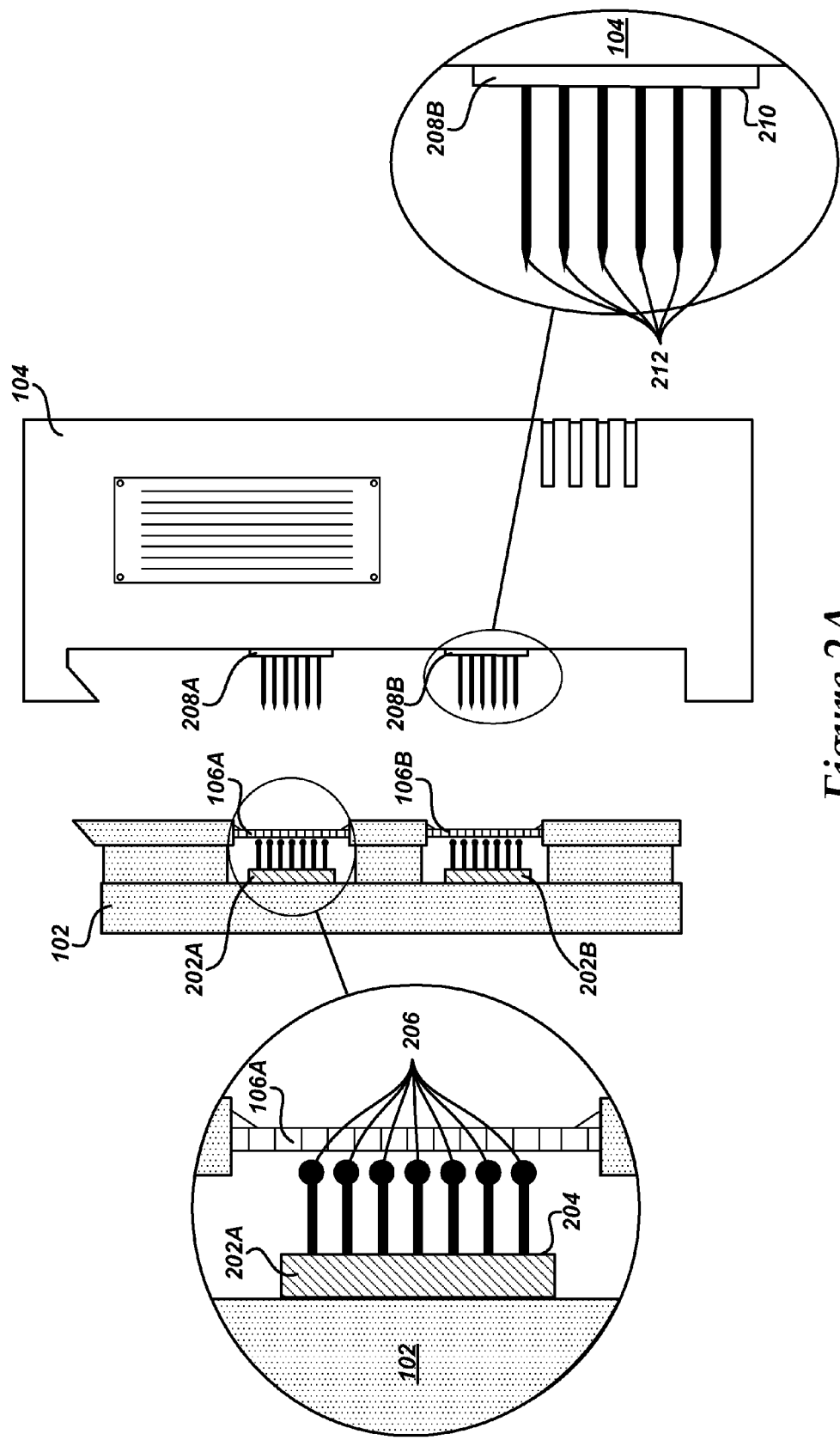
FIGS. 2A-2B are cross-sectional views of the mounting framework incorporating the randomly-accessible busbar showing the attachment of an equipment module to the busbar, according to embodiments presented herein.
Figure 2B:
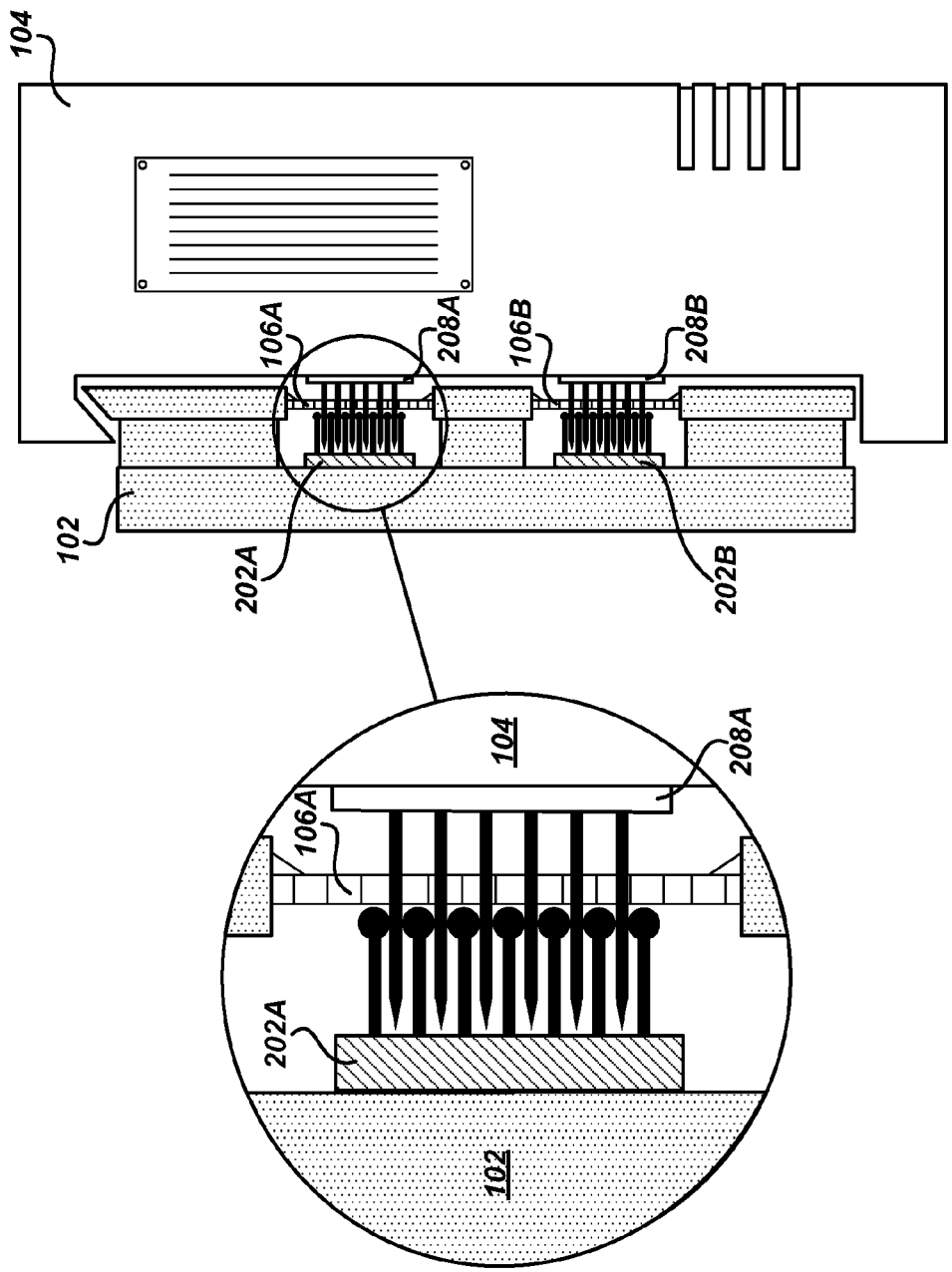

FIGS. 2A and 2B show cross-sectional views, taken generally along line 2-2 of FIG. 1, of the mounting framework 102 and the associated equipment module 104. As shown in FIG. 2A, the busbars 202A-202B are incorporated within the mounting framework 102 behind the protective fabric covers 106A-106B. According to one embodiment, the busbars 202A-202B may include an electrically conductive surface 204 having multiple conductive bristles 206 protruding from the surface 204. The surface 204 of the busbar 202A-202B may be flat or curved, with the bristles 206 extending outward roughly perpendicular to the surface 204. The busbar 202A-202B may be attached to the mounting framework 102 in such a way as to be electrically isolated from the mounting framework 102, with the power or signal source electrically coupled to the busbar 202A-202B.

According to one embodiment, mating connectors 208A-208B are incorporated into the equipment module 104 at locations corresponding to the positions of the busbars 202A-202B incorporated into the mounting framework 102. In another embodiment, a mating connector may be connected to the end of a cable to allow the cable to be connected to the randomly-accessible busbar 202A-202B. The mating connectors 208A-208B may include a conductive surface 210 with protruding conductive bristles 212. As with the busbar 202A-202B, the surface 210 of the mating connector 208A-208B may be flat or curved, with the bristles 212 extending outward roughly perpendicular to the surface 210.

The busbars 202A-202B and mating connectors 208A-208B are configured such that when the equipment module 104 is attached to the mounting framework 102, the conductive bristles 212 of the mating connectors 208A-208B will penetrate the protective fabric covers 106A-106B and interdigitate with the conductive bristles 206 of the corresponding busbars 202A-202B, as illustrated in FIG. 2B. The interdigitating conductive bristles 206, 212 form an electrical connection between the mating connector 208A-208B and the busbar 202A-202B by providing multiple points of contact for multiple, redundant current paths.

It will be appreciated by one skilled in the art that the number of conductive bristles shown in the accompanying figures is for clarity, and that more or fewer bristles may be included on the busbars 202A-202B and/or mating connectors 208A-208B than shown in FIGS. 2A-2B. The number of conductive bristles 206, 212 protruding from the busbars 202A-202B and mating connectors 208A-208B may depend upon a number of factors, including, but not limited to, the type of material used in the construction of the bristles, the diameter, length, and rigidity of the bristles, and the characteristics of the electronic signal being passed through the connection, such as amperage, voltage, frequency, etc. In addition, it will be further appreciated that the components illustrated in the accompanying figures are not shown to scale.

The conductive bristles 212 of the mating connectors 208A-208B may be made of a conductive material with sufficient tensile strength to penetrate the protective fabric cover, but flexible enough to intertwine with the conductive bristles 206 of the busbar 202A-202B. In addition, the choice of material for the conductive bristles 212 may depend upon the characteristic of signal being passed through the connection, such as frequency or amperage, as well as environmental factors, such as temperature and humidity. In one embodiment, the conductive bristles 212 are made of beryllium copper. It will be appreciated, however, that the conductive bristles may be made of any conductive material recognized as suitable for connector pins and sockets in the aerospace industry or other industries. Other example materials may include, but are not limited to, brass, stainless steel, or conductive-polymer-coated carbon nanotubes.

The length and diameter of the conductive bristles 212 of the mating connectors 208A-208B may also depend upon the characteristic of signal being passed through the connection as well other mechanical features, such as the shape and dimensions of the busbar 202A-202B and the mating connectors 208A-208B. In one embodiment, the conductive bristles 212 of the mating connectors 208A-208B may be formed with pointed ends so as to more easily penetrate the protective fabric cover 106A-106B when the mating connector 208A-208B is connected to the busbar 202A-202B.

The material, length, and diameter of the conductive bristles 206 of the busbars 202A-202B may be selected based upon the same factors and considerations as those used in the construction of the conductive bristles 212 of the mating connectors 208A-208B described above. In one embodiment, the material and diameter of the conductive bristles 206 of the busbars 202A-202B and the conductive bristles 212 of the mating connectors 208A-208B are the same. According to another embodiment, the conductive bristles 206 of the busbars 202A-202B may be formed with round or blunt ends so that the bristles do not penetrate the protective fabric cover 106A-106B when a mating connector 208A-208B is connected to the busbar 202A-202B. In a further embodiment, a wire or plastic mesh may be attached to the outer ends of the conductive bristles 206 of the busbars 202A-202B such that the bristles will not penetrate the protective fabric cover 106A-106B if an object, such as a tool or finger, presses the protective fabric cover 106A-106B against the conductive bristles 206.

As described briefly above, the protective fabric covers 106A-106B are configured to reduce the risk of accidental contact with the busbars 202A-202B from persons installing equipment modules or otherwise working in the avionics bay. The protective fabric covers 106A-106B may also protect the busbars 202A-202B from environmental contamination, such as dust or dirt. In addition, the protective fabric covers 106A-106B may serve to clean such contamination from the conductive bristles 212 of the mating connectors 208A-208B as they pass through the fabric covers during connection to the busbar 202A-202B.

According to embodiments, the protective fabric covers 106A-106B may be made of a fabric woven from nonconductive fibers. In one embodiment, the woven fabric may be porous enough to allow the conductive bristles 212 of the mating connectors 208A-208B to penetrate the fabric without causing damage, but not so porous as to allow contact between another object, such as a tool or finger, and the conductive bristles 206 of the busbars 202A-202B located underneath the protective fabric covers 106A-106B.

The materials utilized for the fibers of the woven fabric will depend upon various factors relating to the operating environments where the protective fabric covers 106A-106B are used. For example, for use in the avionics bay of an aircraft, the applicable guidelines may specify that the fabric be flame retardant and remain flexible in operating temperatures as low as −55° C. In one embodiment, the protective fabric covers 106A-106B are woven from extruded fluorinated ethylene propylene (FEP) fibers. It will be appreciated, however, that any number of nonconductive materials known in the art may be utilized for the fibers of the woven fabric, including, but not limited to, nylon, fiberglass, or an ethylene-tetrafluoroethylene fluoropolymer, such as DUPONT™ TEFZEL® from E.I. du Pont de Nemours and Company of Wilmington, Del.

Figure 3:
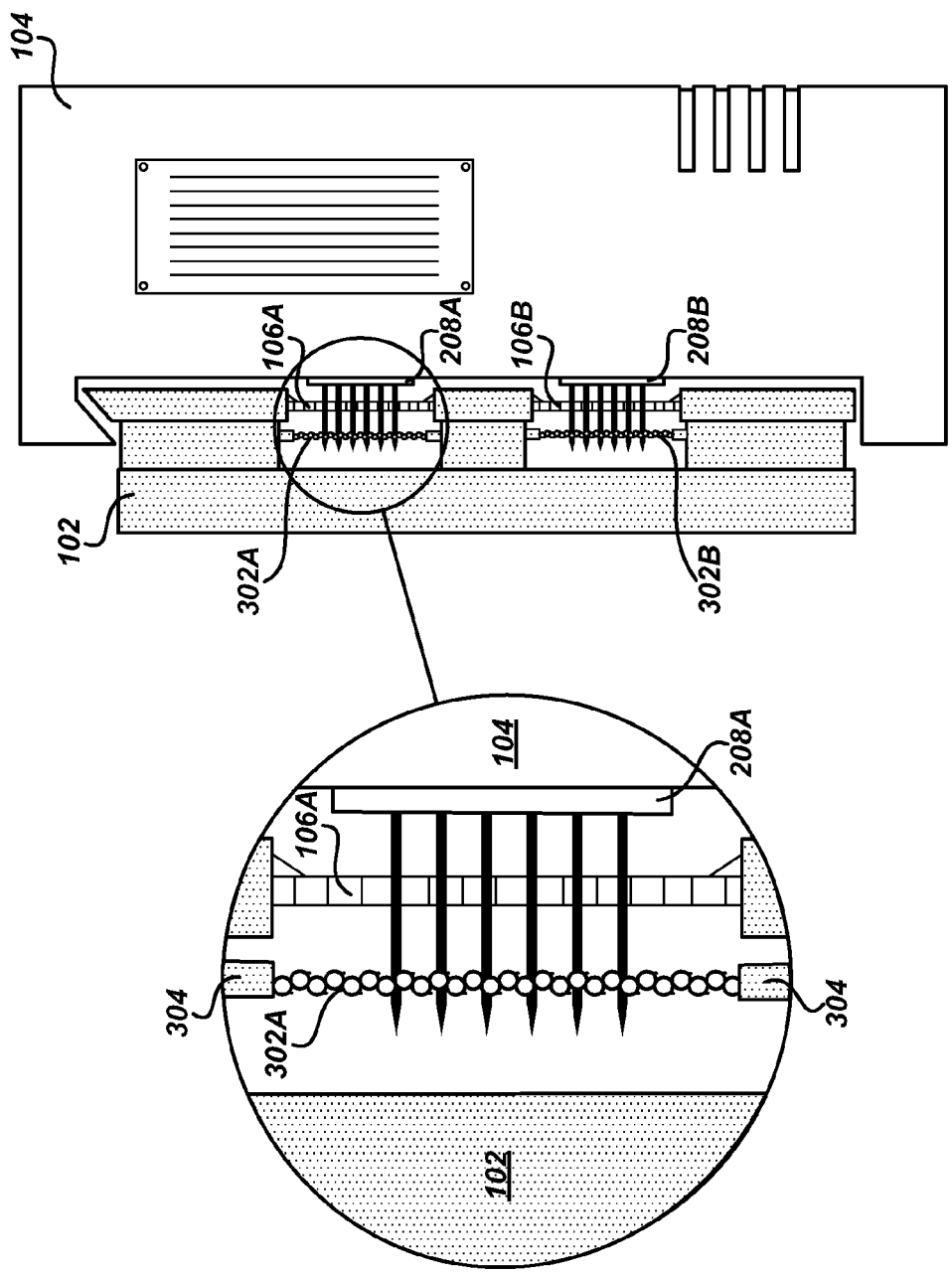
FIG. 3 is a cross-sectional view of a mounting framework incorporating an electrically conductive fabric bus showing the attachment of an equipment module to the fabric bus, according to embodiments presented herein.

According to another embodiment, the mounting framework 102 may incorporate conductive fabric buses instead of the bristled busbars 202A-202B. As illustrated in FIG. 3, the conductive fabric buses 302A-302B may consist of a conductive fabric stretched between two mounting points 304 as to be electrically isolated from the mounting framework 102. Like the busbars 202A-202B described above, the conductive fabric buses 302A-302B run a length along the mounting framework 102 with the power or signal source electrically coupled to the fabric bus, allowing connections by mating connectors 208A-208B at any point along the bus.

When a mating connector 208A-208B is connected to the conductive fabric bus 302A-302B, the conductive bristles 212 of the mating connector 208A-208B pass through the protective fabric cover 106A-106B and penetrate or otherwise contact the conductive fabric. The intermingling of the conductive bristles 212 with the fibers of the conductive fabric bus 302A-302B forms the electrical connection. Accordingly, the conductive fabric bus 302A-302B may be woven from conductive fibers that will not be damaged when penetrated by the conductive bristles 212 of the mating connectors 208A-208B, in order to support numerous connections and disconnections in the same spot. In one embodiment, the conductive fabric bus 302A-302B is woven from fibers made from a polymer and carbon nanotube mixture, having the conductivity of copper alloys with the flexibility of polymeric fibers. It will be appreciated that the conductive fabric bus may be woven from fibers of any number of flexible, conductive materials, including, but not limited to, aluminum.

Based on the foregoing, it should be appreciated that technologies for a randomly-accessible electrical bus with protective cover and associated mating connector are provided herein. The subject matter described above is provided by way of illustration only and should not be construed as limiting. Various modifications and changes may be made to the subject matter described herein without following the example embodiments and applications illustrated and described, and without departing from the true spirit and scope of the present invention, which is set forth in the following claims.

What is claimed is:

1. An electrical connection apparatus comprising:
    a busbar comprising an electrically conductive surface having a plurality of electrically conductive bristles disposed substantially perpendicular therefrom;
    a nonconductive fabric cover covering the plurality of electrically conductive bristles disposed from the electrically conductive surface of the busbar; and
    a mating connector comprising an electrically conductive surface having a plurality of electrically conductive bristles disposed substantially perpendicular therefrom, wherein a connection between the mating connector and the busbar is created by the plurality of electrically conductive bristles disposed from the electrically conductive surface of the mating connector penetrating through the nonconductive fabric cover and interdigitating with the plurality of electrically conductive bristles disposed from the electrically conductive surface of the busbar.

2. The apparatus of claim 1, wherein the busbar is of arbitrary size along a first dimension allowing a mating connector of fixed size to be connected to the busbar at any position along the first dimension of the busbar.

3. The apparatus of claim 2, wherein multiple mating connectors may be connected to the busbar at various positions along the first dimension of the busbar.

4. The apparatus of claim 1, wherein the nonconductive fabric cover is configured to reduce the risk of a contact between a person and the electrically conductive surface of the busbar or the plurality of electrically conductive bristles disposed from the electrically conductive surface of the busbar.

5. The apparatus of claim 1, wherein each of the plurality of electrically conductive bristles disposed from the electrically conductive surface of the mating connector is configured with a pointed end such that the bristle may penetrate the nonconductive fabric cover when a force is applied between the mating connector and the nonconductive fabric cover.

6. The apparatus of claim 5, wherein each of the plurality of electrically conductive bristles disposed from the electrically conductive surface of the busbar is configured with a blunt surface such that the bristle will not penetrate the nonconductive fabric cover when a force is applied between the nonconductive fabric cover and the busbar.

7. The apparatus of claim 1, wherein the plurality of electrically conductive bristles are made from beryllium copper, stainless steel, or conductive-polymer-coated carbon nanotubes.

8. The apparatus of claim 1, wherein the nonconductive fabric cover comprises a fabric woven from nonconductive polymeric fibers.

9. The apparatus of claim 8, wherein the nonconductive polymeric fibers comprise nylon, fiberglass, fluorinated ethylene propylene, or an ethylene-tetrafluoroethylene fluoropolymer.

10. A system for connecting an equipment module to a power bus, comprising:

a mounting framework comprising a means for mounting the equipment module;

a power bus attached to the mounting framework comprising an electrically conductive surface having a plurality of electrically conductive bristles disposed substantially perpendicular therefrom;

a nonconductive fabric cover attached to the mounting framework covering the power bus; and a mating connector attached to the equipment module comprising an electrically conductive surface having a plurality of electrically conductive bristles disposed substantially perpendicular from therefrom, wherein when the equipment module is mounted to the mounting framework, the plurality of electrically conductive bristles disposed from the electrically conductive surface of the mating connector penetrate the nonconductive fabric cover and interdigitate with the plurality of electrically conductive bristles disposed from the electrically conductive surface of the power bus, establishing a connection between the power bus and the equipment module.

11. The system of claim 10, wherein the mounting framework and power bus are configured such that multiple equipment modules may be mounted and connected to the power bus at any position along the mounting framework.

12. The system of claim 10, wherein the nonconductive fabric cover is configured to reduce the risk of a contact between a person and the power bus.

13. The system of claim 10, wherein each of the plurality of electrically conductive bristles disposed from the electrically conductive surface of the mating connector is configured with a pointed end, such that the bristle may penetrate the nonconductive fabric cover when the equipment module is mounted to the mounting framework, and wherein each the plurality of electrically conductive bristles disposed from the electrically conductive surface of the power bus is configured with a blunt surface, such that the bristle will not penetrate the nonconductive fabric cover when the equipment module is mounted to the mounting framework.

14. An electrical connection apparatus comprising:
a conductive fabric bus stretched between two conductive supporting members;
a nonconductive fabric cover covering the conductive fabric bus; and
a mating connector comprising an electrically conductive surface having a plurality of electrically conductive bristles disposed substantially perpendicular therefrom,
wherein a connection between the mating connector and the conductive fabric bus is created by the plurality of electrically conductive bristles penetrating the nonconductive fabric cover and contacting the conductive fabric bus.

15. The apparatus of claim 14, wherein the conductive fabric bus comprises a fabric woven from conductive-polymer-coated carbon nanotubes or aluminum fibers.

16. The apparatus of claim 14, wherein the conductive fabric bus is of arbitrary size along a first dimension allowing a mating connector of fixed size to be connected to the conductive fabric bus at any position along the first dimension of the conductive fabric bus.

17. The apparatus of claim 16, wherein multiple mating connectors may be connected to the conductive fabric bus at various positions along the first dimension of the conductive fabric bus.

18. The apparatus of claim 14, wherein the nonconductive fabric cover is configured to reduce the risk of a contact between the conductive fabric bus and a person.

19. The apparatus of claim 14, wherein each of the plurality of electrically conductive bristles is configured with a pointed end such that the bristle may penetrate the nonconductive fabric cover and contact the conductive fabric bus when a force is applied between the mating connector and the conductive fabric bus.

20. The apparatus of claim 14, wherein the plurality of electrically conductive bristles are made from beryllium copper, stainless steel, or conductive-polymer-coated carbon nanotubes.

* * * * *